United States Patent
Yasusaka

(10) Patent No.: US 9,608,617 B2
(45) Date of Patent: Mar. 28, 2017

(54) SHORT CIRCUIT PROTECTION CIRCUIT, SEMICONDUCTOR DEVICE AND ELECTRONIC MACHINE

(71) Applicant: Rohm Co., Ltd., Kyoto (JP)

(72) Inventor: Makoto Yasusaka, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 141 days.

(21) Appl. No.: 14/554,320

(22) Filed: Nov. 26, 2014

(65) Prior Publication Data

US 2015/0155699 A1 Jun. 4, 2015

(30) Foreign Application Priority Data

Nov. 29, 2013 (JP) .................. 2013-247356

(51) Int. Cl.
*H02H 3/08* (2006.01)
*H03K 17/082* (2006.01)

(52) U.S. Cl.
CPC ............... *H03K 17/0822* (2013.01)

(58) Field of Classification Search
CPC .................. H02H 3/08; H03K 17/0822
USPC ........................................... 361/101
See application file for complete search history.

(56) References Cited

U.S. PATENT DOCUMENTS

| | | | | |
|---|---|---|---|---|
| 5,656,968 | A * | 8/1997 | Sander | H03K 17/0822 323/266 |
| 8,508,901 | B2 * | 8/2013 | Nakajima | G01R 19/16571 361/93.1 |
| 2002/0181180 | A1 * | 12/2002 | Ivanov | H03K 17/0822 361/93.9 |
| 2005/0013079 | A1 * | 1/2005 | Mitsuda | H02H 3/087 361/100 |
| 2010/0213909 | A1 * | 8/2010 | Nakashimo | G05F 1/5735 323/282 |

* cited by examiner

*Primary Examiner* — Scott Bauer
(74) *Attorney, Agent, or Firm* — Fish & Richardson P.C.

(57) ABSTRACT

The present disclosure provides a short circuit protection circuit with small area and less current-consuming. A short circuit protection circuit 14 includes a transistor M11 and a resistor R11, serially connected between a source and a drain of an output transistor 11 (transistor M10); and a transistor M12, connected between the source and a gate of the output transistor 11 and forming a current mirror together with the transistor M11.

18 Claims, 10 Drawing Sheets

SHORT CIRCUIT PROTECTION CIRCUIT, SEMICONDUCTOR DEVICE AND ELECTRONIC MACHINE

BACKGROUND

The present disclosure relates to a short circuit protection circuit.

FIG. 12 shows a load switch IC according to a first prior example. In the first prior example t, a load switch IC 30 includes an output transistor 31 for conducting/cutoff an input terminal T31 and an output terminal T32, a gate driver 32 as a mechanism for generating a gate signal of the output transistor 31, and a short circuit protection circuit 33 for protecting the output transistor 31 from being affected by overcurrent when an output short circuit occurs.

Furthermore, the following patent literature 1 is provided as an example of the aforesaid situation in the prior art.

PRIOR ART TECHNICAL LITERATURE

Patent Literature

[Patent literature 1] Japanese Patent Publication No. 2008-257493.

BRIEF SUMMARY OF THE DISCLOSURE

The Problem to be Solved

However, the conventional short circuit protection circuit 33 includes a comparator 331 for detecting overcurrent during short circuit, such that increased area of a chip or increased current consumption becomes an issue. In addition, as shown in FIG. 13, in a load break switch IC 40 of a smaller chip area, short circuit protection is omitted for preferentially ensuring a small chip area or low power consumption, resulting in insufficient protection for short circuit at an output.

In light of the above problems in the prior art, the present disclosure provides a short circuit protection circuit, which requires smaller area and less current consumption.

Technical Means for Solving the Problem

For the above purpose, the short circuit protection circuit of the present disclosure includes the following configuration (a first configuration): a first transistor and a first resistor, serially connected between a source and a drain or between an emitter and a collector of an output transistor; and a second transistor connected between the source and the gate or the emitter and the collector of the output transistor and forming a current mirror with the first transistor.

Furthermore, the short circuit protection circuit having the first configuration may include a configuration of a third transistor (a second configuration), wherein current paths of the first transistor and the second transistor are conducted/cutoff by the third transistor and the above transistors synchronously.

Furthermore, a semiconductor device of the present disclosure is configured to integrate the following components to form a configuration (a third configuration): an output transistor connected between a first external terminal and a second external terminal; a driver circuit for outputting a control signal of the output transistor according to an enable signal; and a short circuit protection circuit including the first or second configuration.

Moreover, in the semiconductor device including the third configuration, the driver circuit is configured to form a configuration (a fourth configuration) including a second resistor, wherein the second resistor is inserted between the gate or a base of the transistor and an applying terminal of a conducting voltage.

Furthermore, in the semiconductor device including the third or the fourth configuration, the output transistor and the first, the second, and the third transistors may be formed as a configuration (a fifth configuration) of a P-channel MOS field effect transistor or a PNP type bipolar transistor.

Furthermore, the semiconductor device including the fifth configuration may be formed as a configuration (a sixth configuration) to function as a high side load switch to conduct/cutoff current path between an applying terminal of a power source voltage and a load.

Furthermore, the semiconductor device including the third or fourth configuration, the output transistor and the first to third transistors may be formed as a configuration (a seventh configuration) of an N channel MOS field effect transistor or an NPN type bipolar transistor.

Furthermore, the semiconductor device including the seventh configuration may be formed as a configuration (an eighth configuration) to function as a low side load switch to conduct/cutoff the current path between a load and ground.

Furthermore, the semiconductor device including the third or fourth configuration may be formed as an integrated configuration (a ninth configuration) of multiple sets of the output transistors, the driver circuits and the short circuit protection circuits.

In addition, an electronic machine of the present disclosure is configured as a configuration (a tenth configuration) of the following components: a control device for generating an enable signal; a semiconductor device receiving the enable signal and including one of the third to the ninth configurations; and a load connected to the semiconductor device.

Effects of the Present Disclosure

In accordance with the present disclosure, a short circuit protection circuit with a smaller area and less current consumption is provided.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
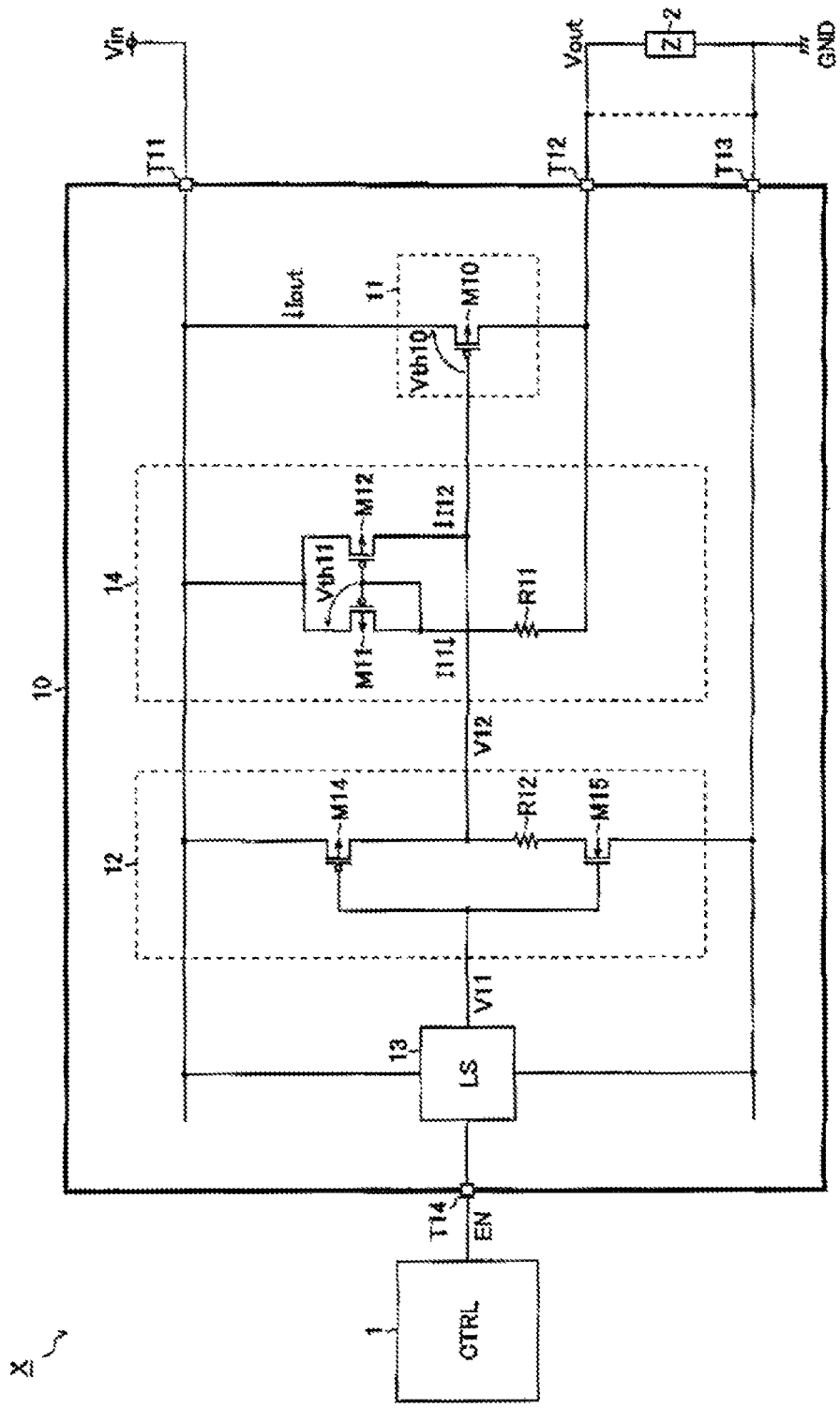
FIG. 1 shows a configuration of an electronic machine in accordance with a first embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

First Embodiment

FIG. 1 shows a configuration of an electronic machine according to a first embodiment of the present disclosure. The electronic machine X of the first embodiment includes a control device 1 (for example, a microcomputer) for generating an enable signal EN; a semiconductor device 10 for receiving an input of the enable signal EN; and a load 2 connected to the semiconductor device 10.

The semiconductor device 10 is a high side load switch IC for conducting/cutoff current path between an applying terminal of a power supply voltage (hereinafter an input voltage Vin) and the load 2, and is formed by integrating an output transistor 11, a gate driver 12, a level shifter 13 and a short circuit protection circuit 14.

Furthermore, the semiconductor device 10 has external terminals T11~T14 as a mechanism for ensuring electrical connection outside the device. Outside the semiconductor device 10, an external terminal (input pin) T11 is connected to an applying terminal of the input voltage Vin. An external terminal (output pin) T12 is connected to the load 2. An external terminal (ground pin) T13 is connected to the ground GND. An external terminal (enable pin) T14 is connected to the control device 1.

The output transistor T11 is a P channel MOS field effect transistor M10 connected between the external terminal T11 and the external terminal T12 so as to conduct/cutoff a current path of output current Iout. The connection relationship is specifically described as follows. A source of the transistor M10 is connected to the external terminal T11. A drain of the transistor M10 is connected to the external terminal T12. A gate of the transistor M10 is connected to an output end of the gate driver 12 (an applying terminal of a gate voltage V12). The transistor M10 is conducted when the gate voltage V12 is at a low level, and is cutoff when the gate voltage V12 is at a high level.

The gate driver 12 is a circuit block for generating the gate voltage V12 (corresponding to a control signal of the output transistor 11) according to an enable voltage V11 (corresponding to the enable signal EN after level shift), and includes a P channel MOS field effect transistor M14, an N channel MOS field effect transistor M15 and a resistor R12. The connection relationship is specifically described as follows. A source of the transistor M14 is connected to the external terminal T11. A drain of the transistor M14 and a first end of the resistor R12 are both connected to a gate of the transistor M10. A second end of the resistor R12 is connected to a drain of the transistor M15. A source of the transistor M15 is connected to the external terminal T13. The gates of the transistors M14 and M15 are both connected to an output terminal of the level shifter 13 (an applying terminal of the enable voltage V11).

When the enable voltage V11 is at a high level, the transistor M14 is cutoff and the transistor M15 is conducted, such that the gate voltage V12 becomes a low level. On the other hand, when the enable voltage V11 is at a low level, the transistor M14 is conducted and the transistor M15 is cutoff, such that the gate voltage V12 becomes a high level. The gate driver 12 functions as an inverter for logically inverting the enable voltage V11 so as to generate the gate voltage V12.

Furthermore, the resistor R12 is inserted between the gate of the output transistor 11 and the applying terminal of the conducing voltage (hereinafter the ground voltage GND) to function as not only a pass rate modulation component when the gate voltage V12 decreases to a low level (i.e. when the transistor M10 is on), but also a part of the short circuit protection circuit 14 (short circuit current setting component). The detailed descriptions are provided as follows.

The level shifter 13 is connected between the external terminal T11 and the external terminal T13 for converting the enable signal EN with a first amplitude (for example, 0 V to 3.3 V) into the enable voltage V11 with a second amplitude (for example, 0 V to 5 V).

The short circuit protection circuit 14 is a circuit block used for protecting the output transistor 11 from being affected by overcurrent when the ground short circuit of the external terminal T12 occurs (GND or low level end referenced to GND is short, referring to the dotted lines in FIG. 1). The short circuit protection circuit 14 includes a P channel MOS field effect transistors M11 and M12, and a resistor R11. The connection relationship is specifically described as follows. Sources of the transistors M11 and M12 are both connected to the external terminal T11. Gates of the transistors M11 and M12 are both connected to a drain of the transistor M11. The drain of the transistor M11 is connected to a first end of the resistor R11. A second end of the resistor R11 is connected to the external terminal T12. The drain of the transistor M12 is connected to the gate of the transistor M10.

The short circuit protection circuit 14 includes a transistor M11 and a resistor R11, which are serially connected between the source and the drain of the output transistor 11 (transistor M10); and a transistor M12 connected between the source and the gate of the output transistor M11 and forming a current mirror with the transistor M11. The detailed descriptions of a short circuit protection action of a short circuit protection circuit 14 are provided as follows.

When the enable signal EN is increased from the low level to the high level, the enable voltage V11 becomes a high level and the gate voltage V12 becomes a low level. Consequently, since the output transistor 11 is conducted, the external terminal T11 and the external terminal T12 are conducted. Therefore, if no ground short circuit occurs at the external terminal T12, the output voltage Vout applied to the external terminal T12 is substantially consistent with the input voltage Vin. At this time, the voltage between the transistors M11 and M12 (=Vin−Vout) is substantially 0 V, such that the transistors M11 and M12 are cutoff, and there is no current passing through the shout circuit protection circuit 14. Therefore, the current consumption of the short circuit protection circuit 14 is generally 0 μA during normal action.

When there is greater current passing through the output transistor 11 or the ground short circuit occurs at the external terminal T12 so as to decrease the output voltage Vout, and the voltage between the gate and the source (=Vin−Vout) of the transistor M11 is higher than the conducting threshold voltage Vth11 of the transistor M11, drain current I11 begins to flow through the transistor M11. Furthermore, the value of the drain current I11 is determined by the voltage between the gate and the source of the transistor M11 (=Vin−Vout), the conducting threshold voltage Vth11 of the transistor M11, and the resistance value of the resistor R11. Furthermore, in order to inhibit the current consumption during the short circuit protection action, it is more desirable to set the drain current I11 to be small to an extent without adversely affecting detection precision.

Furthermore, the transistor M11 and the transistor M12 form the current mirror, such that when the drain current I11 begins to flow through the transistor M11, the current mirror current I12 corresponding to the drain current I11 begins to flow through the transistor M12. The current mirror current I12 passes through the resistor R12, such that the gate voltage V12 of the output transistor 11 is greater than the ground voltage GND by a voltage value (=I12×R12) corresponding to the current mirror current I12. Consequently, since the conductivity of the output transistor 11 is decreased, the output current Iout is inhibited.

Secondly, the means for setting the short circuit current value (the upper limit Ilimit of the output current Iout) is described in detail as follows. When the ground short circuit occurs at the external terminal T12, Vout=0 V, the following formula (1) is satisfied. Furthermore, in formula (1), Vgs10 is the voltage between the gate and the source of the transistor M10, and Vgs11 is the voltage between the gate and the source of the transistor M11. Furthermore, the voltage Vds between the source and the drain of the transistor M15 can be omitted as a premise of the establishment of the formula (1).

[Math 1]

$$Vgs11 + R11 \cdot I11 = Vgs10 + R12 \cdot I12 \tag{1}$$

if the current mirror ratio of the transistors M11 and M12 or the resistance values of the resistors R11 and R12 are set by R11×I11=R12×I12, the relationship, Vgs11=Vgs10, is established.

In this situation, the output current Iout passing through the transistor M10 and the drain current I11 passing through the transistor M11 are proportional to the respective channel size (W/L), and hence the following formula (2) is satisfied. Furthermore, in the formula (2), the gate length and the gate width of the transistor M10 are L10 and W10, and the gate length and the gate width of the transistor M11 are L11 and W11.

[Math 2]

$$Iout = \frac{W10}{L10} \cdot \frac{L11}{W11} \cdot I11 \tag{2}$$

Furthermore, the drain current I11 is presented by the following formula (3). In the formula (3), Vth11 is the conducting threshold voltage of the transistor M11.

[Math 3]

$$I11 = \frac{Vin - Vth11}{R11} \tag{3}$$

Hence, after the channel size (the gate length L10 and the gate width W10) of the transistor M10 is arbitrarily determined, the short circuit current value (the upper limit Ilimit of the output current Iout) may be consistent with the desired target value by regulating the channel size (the gate length L11 or the gate width W11) of the transistor M11 or the resistance value of the resistor R11.

However, the above formula (1) is not satisfied under the condition that the voltage of the ground short circuit end of the external terminal T12 is not the ground voltage GND. For example, the formula (1) is not satisfied when the voltage of the ground short circuit end of the external terminal T12 is a low voltage VL. Therefore, in the situation that the external terminal T12 has a low level end short circuit other than the ground voltage GND, it is more desirable to set the short circuit current value in consideration of the relationship between the input voltage Vin and the low voltage VL.

If the short circuit protection circuit 14 of the first embodiment is used, the voltage (≈Vin−Vout) between the source and the drain of the transistor M10 is monitored by using the conducting threshold voltage Vth11 of the transistor M11, so as to achieve the short circuit protection action by adding minimal components. Furthermore, according to the above descriptions, if the short circuit protection circuit 14 of the first embodiment is used, the current consumption during normal action is inhibited to 0 μA. Therefore, the short circuit protection function is incorporated into the high side load switch IC, which occupies an ultra-small area and with low power consumption, so as to significantly outperform the existing product without a short circuit protection function.

Figure 2:
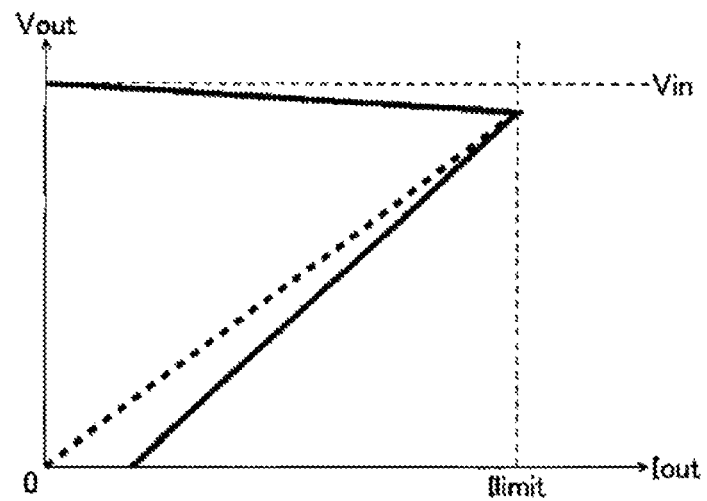
FIG. 2 is a diagram showing the V/I characteristic of a short circuit protection action in accordance with an embodiment of the present disclosure.

FIG. 2 is a diagram showing the V/I characteristic of a short circuit protection action in accordance with an embodiment of the present disclosure. The short circuit protection circuit 14 controls the conductivity of the output transistor 11 to achieve the V/I characteristic (i.e. the characteristic of the "フ" shape) indicated by the solid line in the figure. In order to achieve this V/I characteristic, it is important to enhance the relative precision (paring property) between the transistor M10 with the output current Iout passing through and the transistor M11 with the drain current I11 passing through for short circuit detection.

However, the size ratio of the transistor M10 to the transistor M11 is very large (for example, 100,000:1), and therefore the above V/I characteristic is easily affected by the fluctuation of manufacturing process. As indicated by the dotted line in the figure, if the output voltage Vout is 0 V and the gate voltage V12 is increased to the extent that no output current Iout flows, the transistor M10 cannot be conducted even the enable signal EN is increased to a high level, causing enabling defect (referring to the dotted line in FIG. 3).

Hence, in order to obtain the V/I characteristic indicated by the solid line in FIG. 2 by using the short circuit protection circuit 14 of the first embodiment, the component constant (such as the conducting threshold voltage Vth11 of the transistor M11 or the resistance value of the resistor R11) of the short circuit protection circuit 14 is slightly modulated by laser trimming.

Second Embodiment

Figure 4:
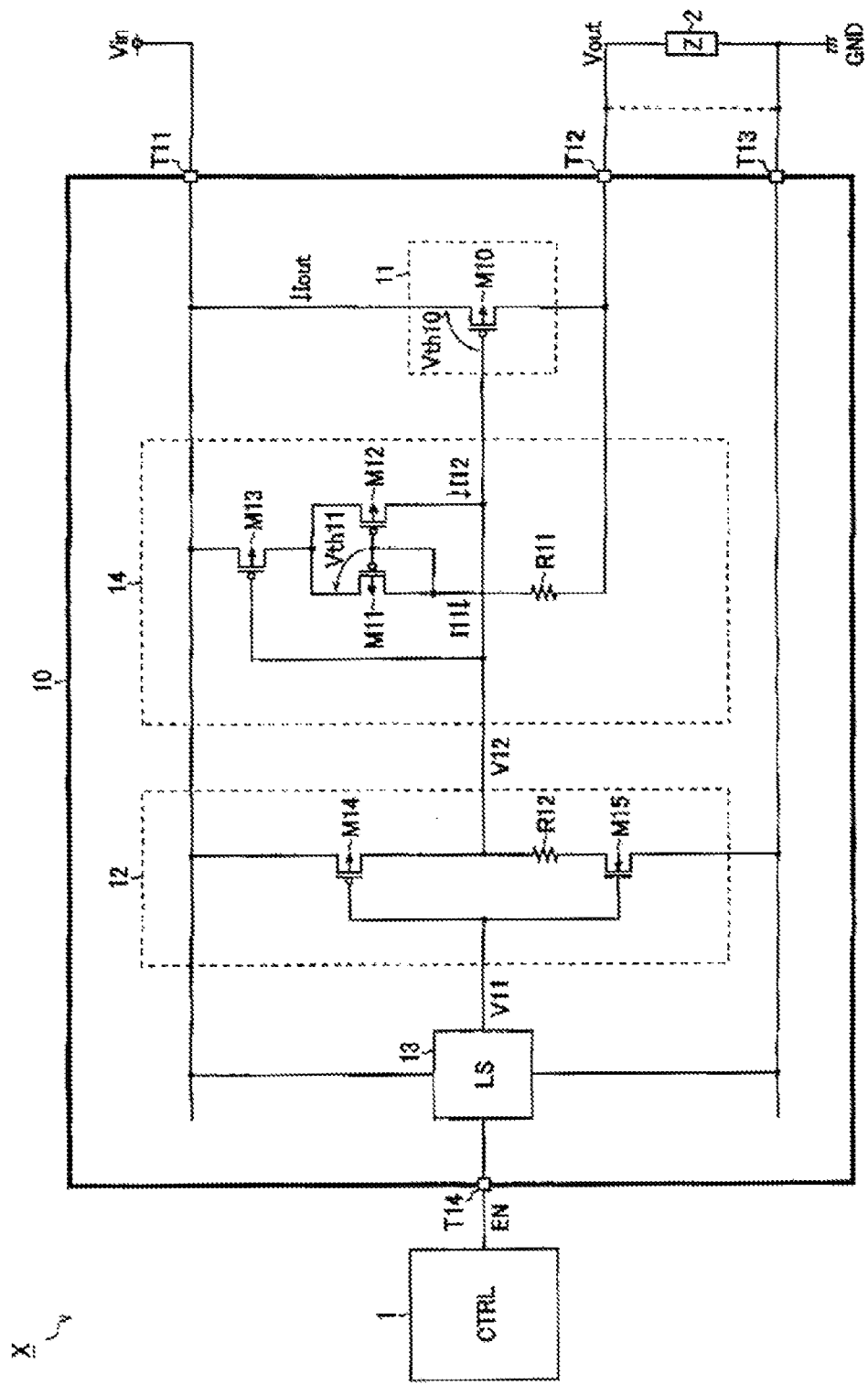
FIG. 4 shows a configuration of an electronic machine in accordance with a second embodiment of the present disclosure.

FIG. 4 shows a configuration of an electronic machine according the second embodiment of the present disclosure. The electronic machine X of the second embodiment is a similar configuration to that of the first embodiment, and is characterized in that a P channel MOS field effect transistor M13 is further added as a component for the short circuit protection circuit 14. Therefore, the essential components similar to those in FIG. 1 are referred to as the same reference numerals to those indicated in FIG. 1, and the corresponding descriptions are omitted. The features in FIG. 2 are discussed as follows.

The current paths of the transistors M11 and M12 are conducted/cutoff by the transistor M13 and the output transistor 11 (transistor M10) synchronously. The connection relationship is specifically described as follows. A source of the transistor M13 is connected to the external terminal T11. A drain of the transistor M13 is connected to the sources of the transistors M11 and M12. A gate of the transistor M13 is connected to the gate of the transistor M10.

Accordingly, the transistor M13, which is inserted between the sources of the transistors M11 and M12 and the external terminal T11, and the transistor M10 have a common gate. Hence, when the output voltage Vout is low, the drain current I12 passes through the short circuit protection circuit 14 so as to increase the gate voltage V12, not only the conductivity of the transistor M10 is decreased but also the conductivity of the transistor M13 is decreased. Consequently, since the current supply to the short circuit protection circuit 14 is limited, the drain current I12 is decreased, such that the gate voltage V12 is not increased to a level that no output current Iout flows.

Figure 3:
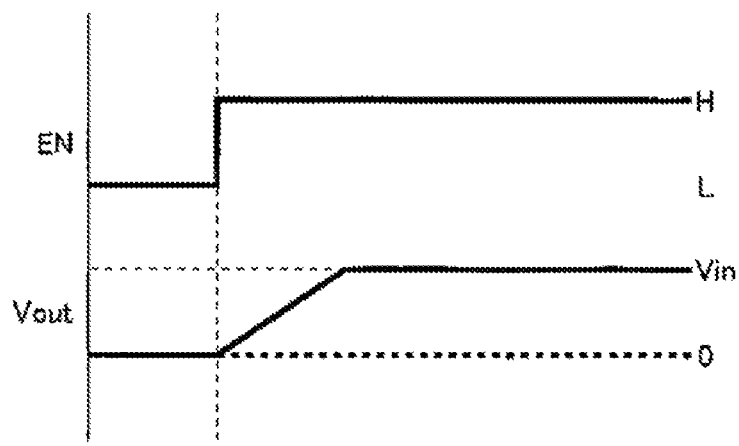
FIG. 3 is a diagram showing time sequence of an enable action in accordance with an embodiment of the present disclosure.

Therefore, if the short circuit protection circuit 14 of the second embodiment is used, there is no need to slightly modulate the component constant to achieve the required V/I characteristic, so as to eliminate enabling defect (complete cutoff of the transistor M10) (referring to the solid lines in FIGS. 2 and 3).

Third Embodiment

Figure 5:
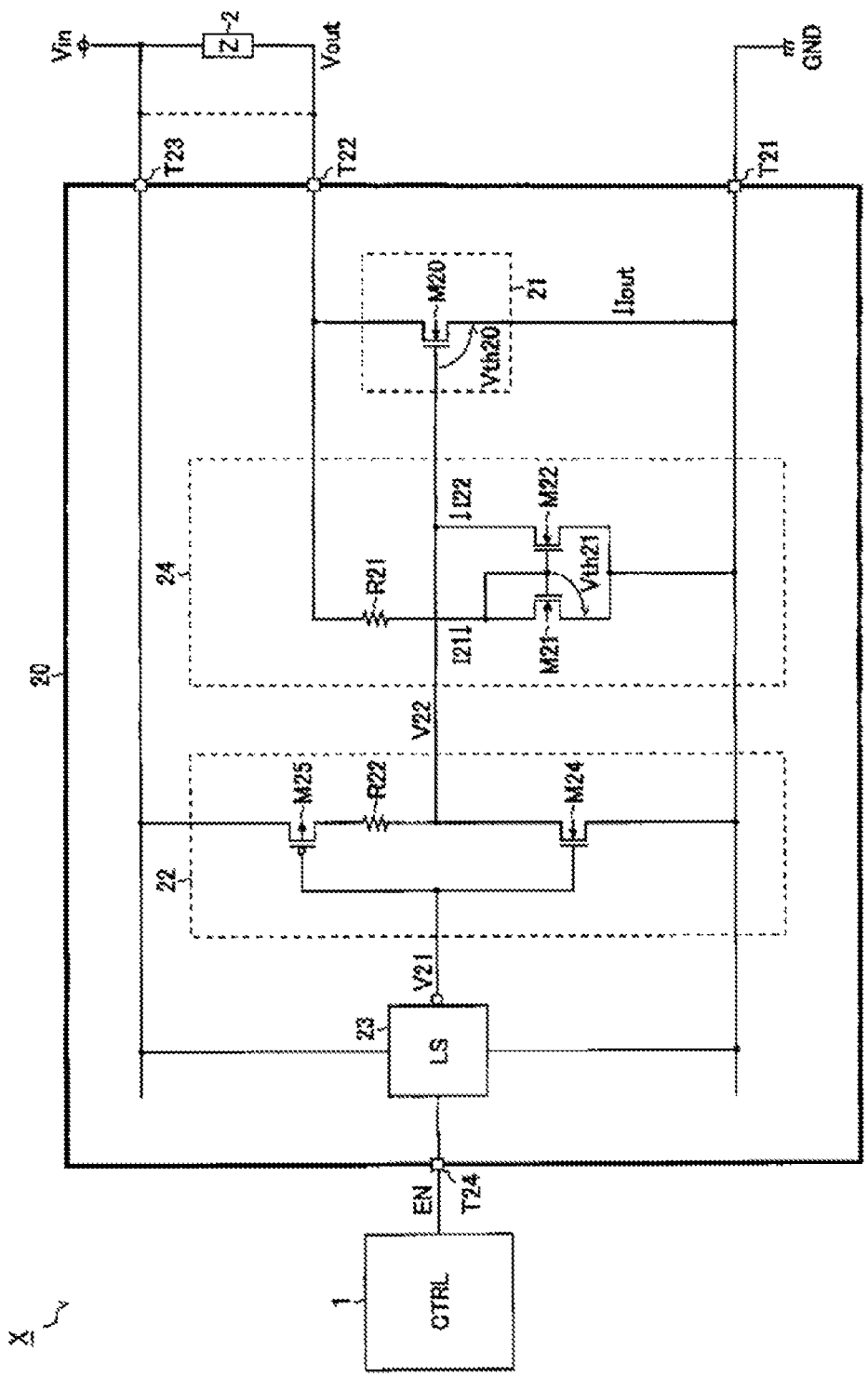
FIG. 5 shows a configuration of an electronic machine in accordance with a third embodiment of the present disclosure.

FIG. 5 shows a configuration of an electronic machine according to a third embodiment. Similar to the configuration of the aforesaid first embodiment or the second embodiment, the electronic machine X of the third embodiment includes a control device 1 (for example, microcomputer) for generating an enable signal EN; a semiconductor device 20 for receiving an input of the enable signal EN; and a load 2 connected to the semiconductor device 20.

The semiconductor 20 is a low side load switch IC for conducting/cutoff current path between the load 2 and the ground GND, and is formed by integrating an output transistor 21, a gate driver 22, a level shifter 23 and a short circuit protection circuit 24.

Furthermore, the semiconductor device 20 has external terminals T21~T24 as a mechanism for ensuring electrical connection outside the device. Outside the semiconductor device 20, the external terminal (ground pin) T21 is connected to the ground GND. The external terminal (output pin) T22 is connected to the load 2. The external terminal (input pin) T23 is connected to an applying end of the power supply voltage (herein, an input voltage Vin). The external terminal (enable pin) T24 is connected to the control device 1.

The output transistor 21 is an N channel MOS field effect transistor M20 connected between the external terminal T21 and the external terminal T22 so as to for conduct/cutoff a current path of output current Iout. The connection relationship is specifically described as follows. A source of the transistor M20 is connected to the external terminal T21. A drain of the transistor M20 is connected to the external terminal T22. A gate of the transistor M20 is connected to an output end of the gate driver 22 (an applying terminal of the gate voltage V22). The transistor M20 is conducted when the gate voltage V22 is at a high level, and is cutoff when the gate voltage V22 is at a low level.

The gate driver 22 is a circuit block for generating a gate voltage V22 (corresponding to the control signal of the output transistor 21) according to the enable voltage V21 (corresponding to the enable signal EN after level shift), and includes an N channel MOS field effect transistor M23, a P channel MOS field effect transistor M25 and a resistor R22. The connection relationship is specifically described. A source of the transistor M24 is connected to the external terminal T21. A drain of the transistor T24 and a first end of the resistor R22 are both connected to the gate of the transistor M20. A second end of the resistor R22 is connected to a drain of the transistor M25. A source of the transistor is connected to the external terminal T23. The gates of the transistor M24 and the transistor M25 are both connected to an inverse output terminal (an applying terminal of the enable voltage V21) of the level shifter 23.

When the enable voltage V21 is at a low level, the transistor M24 is cutoff and the transistor M25 is conducted, such that the gate voltage V22 becomes a high level. On the other hand, when the enable voltage V21 is at a high level, the transistor M24 is conducted and the transistor M25 is cutoff, such that the gate voltage V22 becomes a low level. The gate driver 22 functions as an inverter for logically inverting the enable voltage V21 so as to generate the gate voltage V22.

Furthermore, the resistor R22 is inserted between the gate of the output transistor 21 and the applying terminal of the conducting voltage (hereinafter the input voltage Vin) to function as not only a pass rate modulation component when the gate voltage V22 increases to a high level (i.e. when the transistor M20 is on), but also a part of the short circuit protection circuit 24 (short circuit current setting component). The detailed descriptions are provided as follows.

The level shifter 23 is connected between the external terminal T21 and the external terminal T23 for converting the enable signal EN with a first amplitude (for example, 0 V to 3.3 V) into the enable voltage V21 with a second amplitude (for example, 0 V to 5 V). Furthermore, an output terminal of the level shifter 23 is configured as an inverting form so as to output an enable voltage V21 as a logically inversion of the enable signal EN.

The short circuit protection circuit 24 is a circuit block for protecting the output transistor 21 from being affected by overcurrent when the power supply short circuit occurs at the external terminal T22 (the applying terminal of the input voltage Vin or a high level end referenced to the applying terminal is short, referring to the dotted line in FIG. 5), and includes a P channel MOS field effect transistors M11 and M12, and a resistor R11. The connection relationship is specifically described. The gates of the transistors M21 and M22 are both connected to the drain of the transistor M21. The drain of the transistor M21 is connected to the first end of the resistor R21. The second end of the resistor R21 is connected to the external terminal T22. The drain of the transistor M22 is connected to the gate of the transistor M20.

Accordingly, the short circuit protection circuit 24 includes a transistor M21 and a resistor R21, which are serially connected between the source and the drain of the output transistor 21 (transistor M20); and a transistor M22 connected between the source and the gate of the output transistor 21 and forming a current mirror with the transistor M21. The short circuit protection action of the short circuit protection circuit 24 is discussed in detail in the following descriptions.

When the enable signal EN is increased from the low level to the high level, the enable voltage V21 becomes a low level and the gate voltage V22 becomes a high level. Consequently, since the output transistor 21 is conducted, the external terminal T21 and the external terminal T22 are conducted. Hence, if no power supply short circuit occurs at the external terminal T22, the output voltage Vout applied to the external terminal T22 is substantially consistent with the ground voltage GND. At this time, the voltage between the gate and the source of the transistors M21 and M22 (=Vout−GND) is substantially 0 V, such that the transistors M21 and M22 are cutoff, and there is no current passing through the short circuit protection circuit 24. Therefore, the current consumption of the short circuit protection circuit 24 is generally 0 µA during normal action.

When there is greater current passing through the output transistor 21 or the power supply short circuit occurs at the external terminal T22 so as to increase the output voltage Vout, and the voltage between the gate and the source of the transistor M21 (=Vout−Vout) is higher than the conducting threshold voltage Vth21 of the transistor M21, the drain current I21 begins to flow through the transistor M21. Furthermore, the value of the drain current I21 is determined by the voltage between the gate and the source of the transistor M21 (=Vin−GND), the conducting threshold voltage Vth21 of the transistor M21, and the resistance value of the resistor R21. Furthermore, in order to inhibit the current consumption during the short circuit protection action, it is more desirable to set the drain current I21 to be small to an extent without adversely affecting detection precision.

Furthermore, the transistor M21 and the transistor M22 form the current mirror, such that when the drain current I21 begins to flow through the transistor M21, the current mirror current I22 corresponding to the drain current I21 begins to flow through the transistor M22. The current mirror current I22 passes through the resistor R22, such that the gate voltage V22 of the output transistor 21 is lower than the input voltage Vin by a voltage value (=I22×R22) corresponding to the current mirror current I22. Consequently, since the conductivity of the output transistor 21 is decreased, the output current Iout is inhibited.

Secondly, the means for setting the short circuit current value (the upper limit Ilimit of the output current Iout) is described in detail as follows. When the power supply short circuit occurs at the external terminal T22, Vout=Vin, the following formula (4) is satisfied. Furthermore, in formula (4), Vgs20 is the voltage between the gate and the source of the transistor M20, and Vgs21 is the voltage between the gate and the source of the transistor M21. Furthermore, the voltage Vds between the source and the drain of the transistor M25 can be omitted as a premise of the establishment of the formula (4).

[Math 4]

$$Vgs21 + R21 \cdot I21 = Vgs20 + R22 \cdot I22 \quad (4)$$

if the current mirror ratio of the transistor M21 to the transistor M22 or the resistance values of the resistor R21 and the resistor R22 are set by R21×I21=R22×I22, the relationship, Vgs21=Vgs20, is established.

In this situation, the output current Iout passing through the transistor M20 and the drain current I21 passing through the transistor M21 are proportional to the respective channel size (W/L), and hence the following formula (5) is satisfied. Furthermore, in the formula (5), the gate length and the gate width of the transistor M20 are L20 and W20, and the gate length and the gate width of the transistor M21 are L21 and W21.

[Math 5]

$$Iout = \frac{W20}{L20} \cdot \frac{L21}{W21} \cdot I21 \quad (5)$$

Furthermore, the drain current I21 is presented by the following formula (6). In the formula (6), Vth21 is the conducting threshold voltage of the transistor M21.

[Math 6]

$$I21 = \frac{Vin - Vth21}{R21} \quad (6)$$

Hence, after the channel size (the gate length L20 and the gate width W20) of the transistor M20 is arbitrarily determined, the short circuit current value (the upper limit Ilimit of the output current Iout) may be consistent with the desired target value by regulating the channel size (the gate length L21 or the gate width W21) of the transistor M21 or the resistance value of the resistor R21.

However, the above formula (4) is not satisfied under the condition that the voltage of the power supply short circuit end of the external terminal T22 is not the input voltage Vin. For example, the formula (4) is not satisfied when the voltage of the power supply short circuit end of the external terminal T22 is a high voltage VH. Therefore, in the situation that the external terminal T22 has a high level end short circuit other than the input voltage Vin, it is more desirable to set the short circuit current value in consideration of the relationship between the input voltage Vin and the high voltage VH.

If the short circuit protection circuit 24 of the third embodiment is used, the voltage (≈Vout−GND) between the source and the drain of the transistor M20 is monitored by using the conducting threshold voltage Vth21 of the transistor M21, so as to achieve the short circuit protection action by adding minimal components. Furthermore, according to the above descriptions, if the short circuit protection circuit 24 of the third embodiment is used, the current consumption during normal action is inhibited to 0 μA. Therefore, the short circuit protection function is incorporated into the low side load switch IC, which occupies an ultra-small area and with low power consumption, so as to significantly outperform the existing product without a short circuit protection function.

Figure 6:
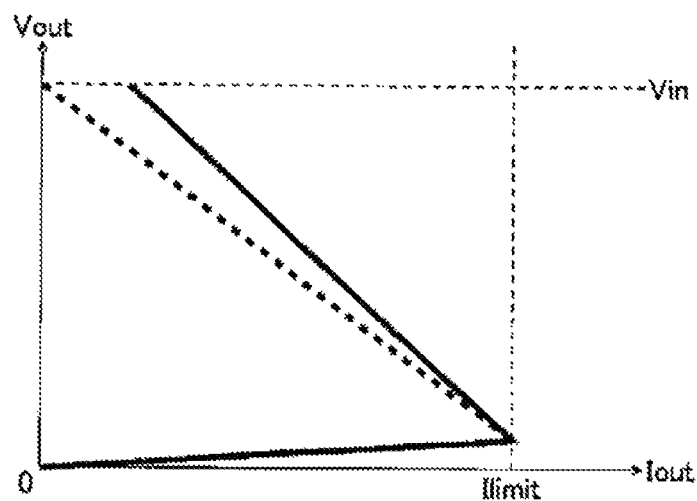
FIG. 6 is a diagram showing the V/I characteristic of a short circuit protection action in accordance with an embodiment of the present disclosure.

FIG. 6 is a diagram showing the V/I characteristic of a short circuit protection action in accordance with the third embodiment of the present disclosure. The short circuit protection circuit 24 controls the conductivity of the output transistor 21 to achieve the V/I characteristic (i.e. the characteristic of the "フ" shape) indicated by the solid line in the figure. In order to achieve this V/I characteristic, it is important to increase the relative precision (paring property) between the transistor M20 with the output current Iout passing through and the transistor M21 with the drain current I21 passing through for the short circuit detection.

However, the size ratio of the transistor M20 to the transistor M21 is very large (for example, 100,000:1), and therefore the above V/I characteristic is easily affected by the fluctuation of manufacturing process. As indicated by the dotted line in the figure, if the output voltage Vout is equal to the input voltage Vin and the gate voltage V22 is decreased to the extent that no output current Iout flows, the transistor M20 cannot be conducted even the enable signal EN is increased to a high level, causing enabling defect (referring to the dotted line in FIG. 7).

Hence, in order to obtain the V/I characteristic indicated by the solid line in FIG. 6 by using the short circuit protection circuit 24 of the third embodiment, the component constant (the conducting threshold voltage Vth21 of the transistor M21 or the resistance value of the resistor R21) of the short circuit protection circuit 24 is slightly modulated by laser trimming.

Fourth Embodiment

Figure 8:
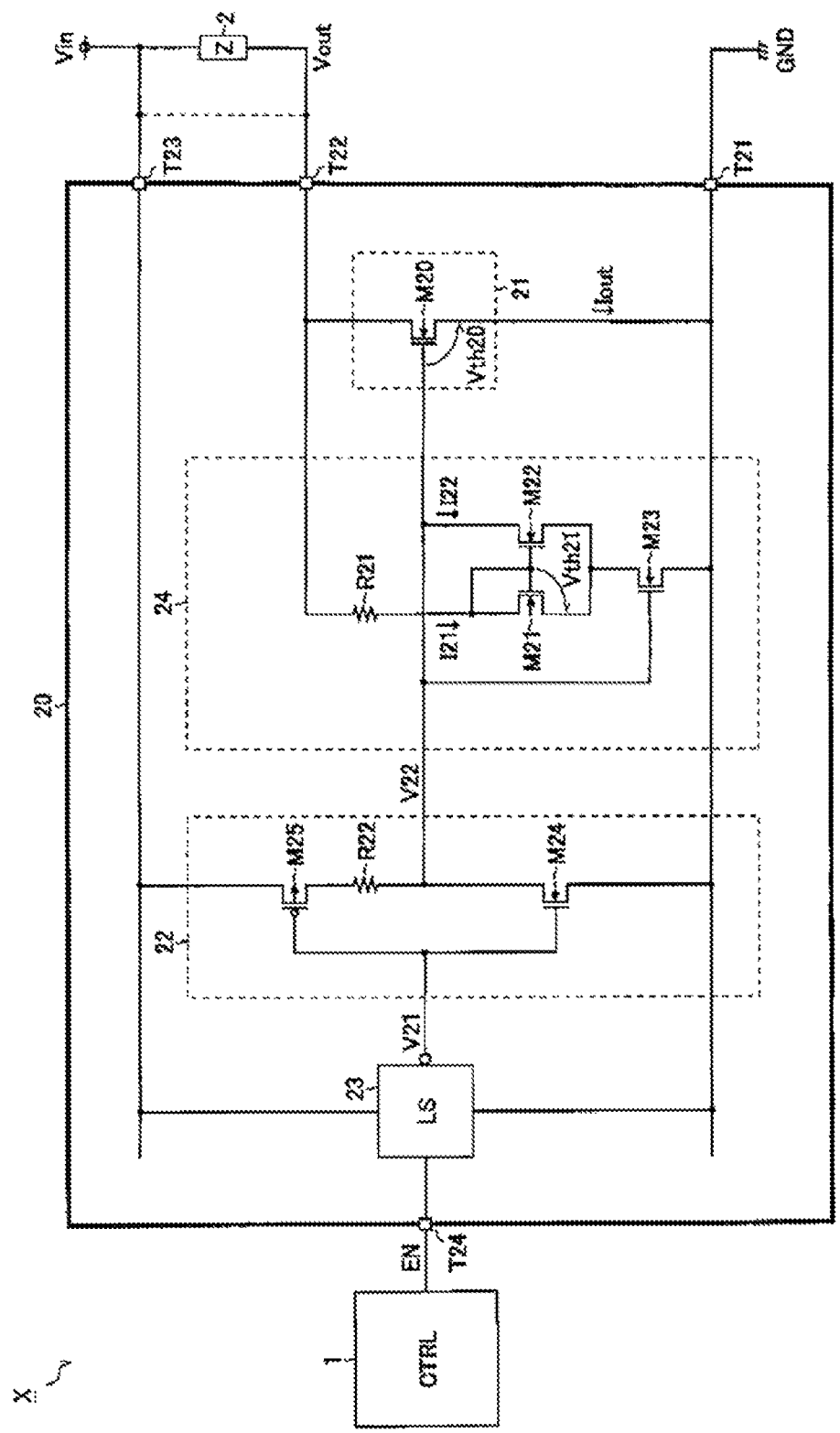
FIG. 8 shows a configuration of an electronic machine in accordance with a fourth embodiment of the present disclosure.

FIG. 8 shows a configuration of an electronic machine according to the fourth embodiment. The electronic machine X of the fourth embodiment is a similar configuration to that of the third embodiment, and is characterized in that an N channel MOS field effect transistor M23 is Furthermore added as an essential component for the short circuit protection circuit 24. Therefore, the essential components similar to those in FIG. 3 are referred to as the same reference numerals to those indicated in FIG. 3, and the corresponding descriptions are omitted. The features in FIG. 4 are discussed as follows.

The current paths of the transistors M21 and M22 are conducted/cutoff by the transistor M23 and the output transistor 21 (transistor M20) synchronously. The connection relationship is specifically described as follows. A source of the transistor M23 is connected to the external terminal T21. A drain of the transistor M23 is connected to the sources of the transistors M21 and M22. A gate of the transistor M23 is connected to the gate of the transistor M20.

Accordingly, the transistor M23, which is inserted between the sources of the transistors M21 and M22 and the external terminal T21, and the transistor M20 have a common gate. Hence, when the output voltage Vout is high, the drain current I22 passes through the short circuit protection circuit 24 so as to decrease the gate voltage V22, not only the conductivity of the transistor M20 is decreased but also the conductivity of the transistor M23 is decreased. Consequently, since the current supply to the short circuit protection circuit 24 is limited, the drain current I22 is decreased, such that the gate voltage V22 is not decreased to a level that no output current Iout flows.

Figure 7:
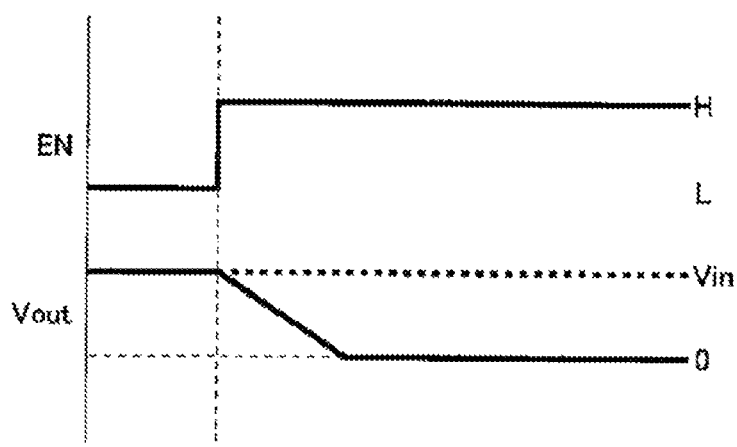
FIG. 7 is a diagram showing time sequence of an enable action in accordance with an embodiment of the present disclosure.

Therefore, if the short circuit protection circuit 24 of the fourth embodiment is used, there is no need to slightly modulate the component constant to achieve the required V/I characteristic, so as to eliminate enabling defect (complete cutoff of the transistor M20) (referring to the solid lines in FIGS. 6 and 7).

<Gate Driver>

Figure 9:
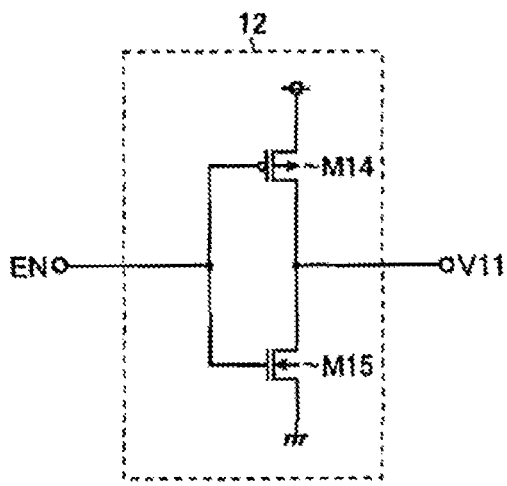
FIGS. 9(A) to 9(D) are circuit diagrams showing a gate driver in accordance with some embodiments of the present disclosure.
Figure 9:
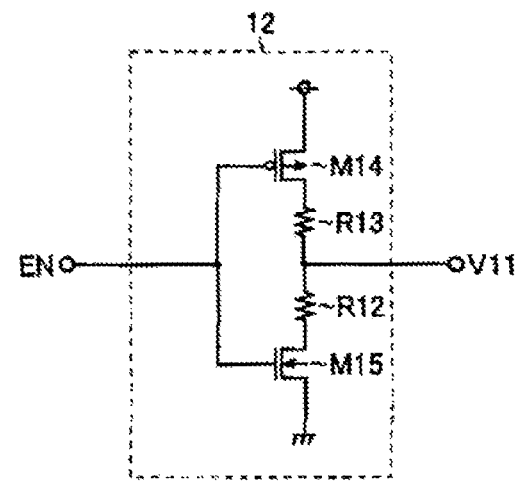
Figure 9:
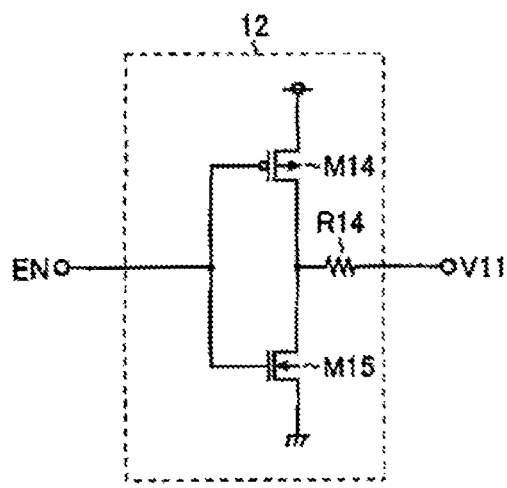
Figure 9:
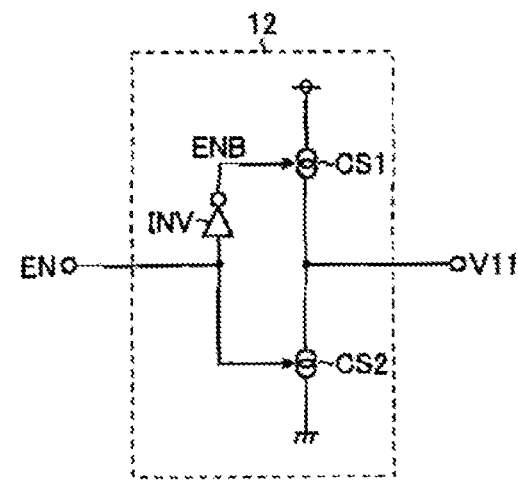

FIG. 9 shows a circuit diagram of the gate driver 12 according to a variation example of the present disclosure. Furthermore, the following descriptions may also be applied to the gate driver 22. However, only the gate driver 12 is described herein as an example.

In FIG. 9(A), the gate driver 12 is configured to omit the resistor R12 of FIG. 1 to FIG. 4. Therefore, in the situation that it is not necessary to modulate the pass rate during conduction, the resistor R12 may also be omitted. However, when this configuration is used, the decrease of the variation of the gate voltage V12 is induced by the drain current I12.

In FIG. 9(B), the gate driver is configured to include the resistor R12 of FIG. 1 to FIG. 4 and to further include a resistor R13 inserted between the drain of the transistor M14 and the applying terminal of the gate voltage V11. Not only the pass rate during conduction may be modulated, but also the pass rate during cutoff may be modulated by using this configuration.

In FIG. 9(C), the gate driver 12 is configured to include a resistor R14 inserted between the connection node of the transistors M14 and M15 and the applying terminal of the gate voltage V11, in replacement of the resistor R12 of FIG. 1 to FIG. 4. The pass rate during conduction and cutoff may be modulated by using a single resistor R14 by using this configuration.

In FIG. 9(D), the gate driver 12 is configured to include current sources CS1 and CS2 in replacement of transistors M14 and M15 of FIG. 1 to FIG. 4. The source current is generated by the current source CS1 according to an inverse enable signal ENB generated by the inverter INV. On the other hand, converging current) is generated by the current source CS2 according to the enable signal EN. The gate voltage V11 varies according to the difference between the source current and the converging current.

Accordingly, various changes may be applied to the gate driver 12 without adversely affecting the action of the short circuit protection circuit 14.

<Embodiment of an Electronic Machine>

Figure 10:
FIG. 10 is a schematic view showing an appearance of a mobile phone (smart phone).
Figure 11:
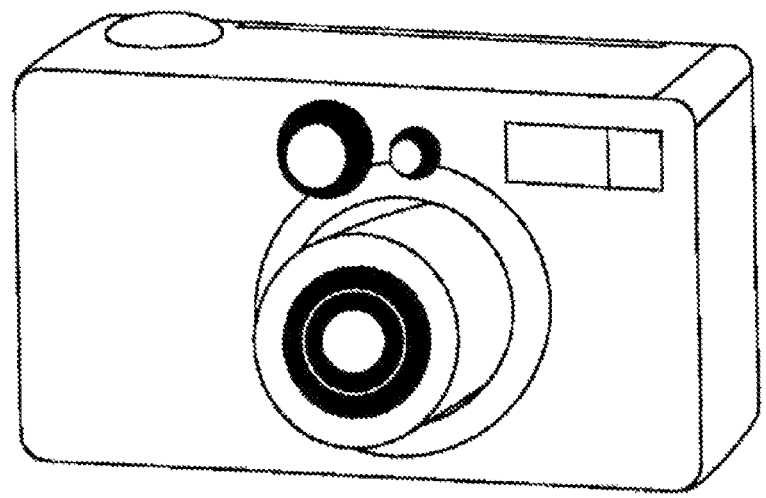
FIG. 11 is a schematic view showing an appearance of a digital still camera.
Figure 12:
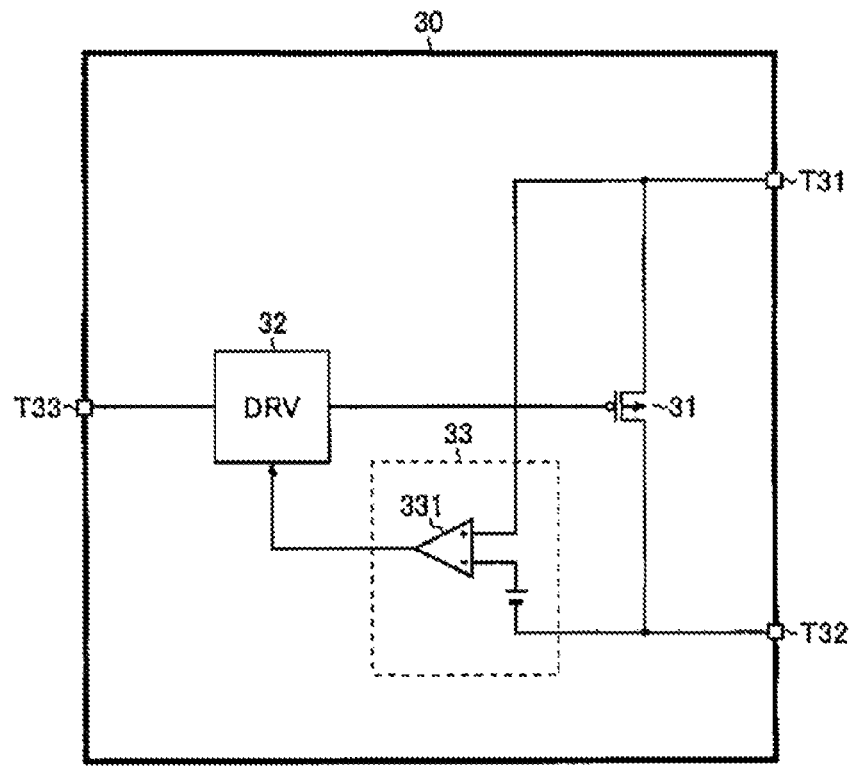
FIG. 12 shows a configuration of a load switch IC in accordance with a first example of the prior art.
Figure 13:
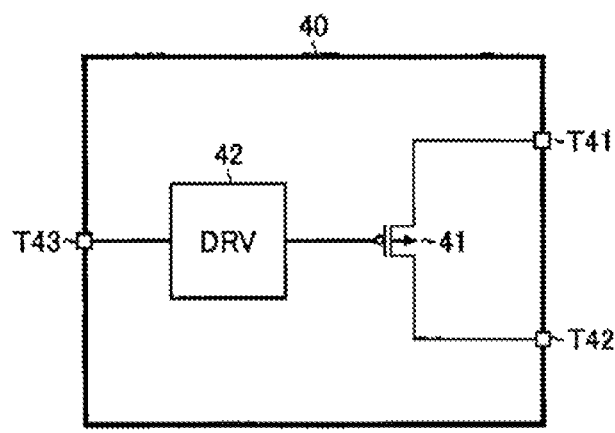
FIG. 13 shows a configuration of a load switch IC in accordance with a second example of the prior art.

FIG. 10 and FIG. 11 respectively shows appearance of a smart phone X1 and a still camera X2. The smart phone X1 and the still camera X2 are both embodiments of an electronic machine. Alternatively, the electronic machine X may be a tablet information terminal, a notebook computer, a digital home appliance, a mobile phone, and etc.

For example, the above load switches IC10 and 20 are used as power switches for the smart phone X1 and the digital still camera X2 so as to increase reliability under an output short circuit without inhibiting the miniaturization or energy saving of the electronic machine.

Other Variation Examples

There may be various modifications to all technical features of the present application in addition to the above embodiments without departing the spirit and the scope of the present disclosure. For example, the N channel MOS field effect transistor may be arbitrarily replaced by an NPN type bipolar transistor, or the P channel MOS field effect transistor may be replaced by a PNP bipolar transistor. Furthermore, when the MOS field effect transistor is replaced by the bipolar transistor, the gate, the source and the drain in the above descriptions can be replaced by a base, an emitter, and a collector, respectively.

In addition, in the above embodiments, only the low side load switch IC or the high side load switch IC with one set of an output transistor, a driver circuit, and a short circuit protection circuit is discussed; however, the present disclosure is not limited thereto. For example, the present disclosure is preferably applied to a power management IC with multiple sets of output transistors, driver circuits, and short circuit protection circuits.

Accordingly, it should be understood that the above embodiments are exemplary illustrations rather than restrictive embodiments, and it should be also understood that the scope of the present disclosure is presented by claims rather than the above embodiments, and includes equivalents and changes of the claims.

INDUSTRIAL APPLICABILITY

The present disclosure may be used in a high side load switch IC, a low side load switch IC, and a power management IC, for example.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A short circuit protection circuit, comprising:
a first transistor and a first resistor serially connected between a source and a drain or between an emitter and a collector of an output transistor, wherein the drain or the collector of the output transistor is arranged to generate an output voltage; and
a second transistor connected between the source and a gate or between the emitter and a base of the output transistor, and forming a current mirror with the first transistor.

2. The short circuit protection circuit of claim 1, further comprising a third transistor, wherein current paths of the first transistor and the second transistor are conducted/cutoff by the third transistor and the output transistor synchronously.

3. A semiconductor device comprising:
an output transistor connected between a first external terminal and a second external terminal;
a driver circuit for generating a control signal of the output transistor according to an enable signal; and
a short circuit protection circuit of claim 1.

4. The semiconductor device of claim 3, wherein the driver circuit comprises a second resistor inserted between the gate or the base of the output transistor and a terminal of an input voltage.

5. The semiconductor device of claim 3, wherein the short circuit protection circuit further comprises a third transistor, and the output transistor and the first, the second, and the third transistors are P channel MOS field effect transistors or PNP bipolar transistors.

6. The semiconductor device of claim 4, wherein the short circuit protection circuit further comprises a third transistor, and the output transistor and the first, the second, and the third transistors are P channel MOS field effect transistors or PNP bipolar transistors.

7. The semiconductor device of claim 5, configured to function as a high side load switch for conducting/cutoff current path between a terminal of a power source voltage and a load.

8. The semiconductor device of claim 6, configured to function as a high side load switch for conducting/cutoff current path between a terminal of a power source voltage and a load.

9. The semiconductor device of claim 3, wherein the short circuit protection circuit further comprises a third transistor, and the output transistor and the first, the second, and the third transistors are N channel MOS field effect transistors or NPN bipolar transistors.

10. The semiconductor device of claim 4, wherein the short circuit protection circuit further comprises a third transistor, and the output transistor and the first, the second, and the third transistors are N channel MOS field effect transistors or NPN bipolar transistors.

11. The semiconductor device of claim 9, configured to function as a low side load switch for conducting/cutoff current path between a load and a ground terminal.

12. The semiconductor device of claim 10, configured to function as a low side load switch for conducting/cutoff current path between a load and a ground terminal.

13. The semiconductor device of claim 3 being integrated by a plurality of the output transistors, the driver circuits, and the short circuit protection circuits.

14. The semiconductor device of claim 4 being integrated by a plurality of the output transistors, the driver circuits, and the short circuit protection circuits.

15. An electronic machine, comprising:
a control device for generating an enable signal;
a semiconductor device of claim 3, receiving an input of the enable signal; and
a load connected to the semiconductor device.

16. A semiconductor device comprising:
a short circuit protection circuit of claim 1;
a first external terminal connected to a terminal of a power supply voltage;
a second external terminal connected to a ground; and
a second resistor connected to the second transistor;
wherein the second resistor and the second transistor are connected between the first external terminal and the second external terminal.

17. The semiconductor device of claim 16, further comprising a third transistor, wherein current paths of the first transistor and the second transistor are conducted/cutoff by the third transistor and the output transistor synchronously.

18. The semiconductor device of claim 16, configured to function as a high side load switch for conducting/cutoff current path between the first external terminal and a load.

* * * * *